United States Patent [19]

Goodin et al.

[11] Patent Number: 4,572,890

[45] Date of Patent: Feb. 25, 1986

[54] PROCESS FOR THE PRODUCTION OF IMAGES

[75] Inventors: Jonathan W. Goodin; Edward Irving, both of Cambridge, England

[73] Assignee: Ciba-Geigy Corporation, Ardsley, N.Y.

[21] Appl. No.: 605,952

[22] Filed: May 1, 1984

[30] Foreign Application Priority Data

May 11, 1983 [GB] United Kingdom ................. 8312879
Jul. 15, 1983 [GB] United Kingdom ................. 8319218

[51] Int. Cl.$^4$ ................................................ G03C 5/00
[52] U.S. Cl. ..................................... 430/325; 430/281; 430/327; 430/328; 430/330; 428/44; 427/12
[58] Field of Search ............... 430/328, 330, 281, 327, 430/325, 280; 428/44; 427/54.1

[56] References Cited

U.S. PATENT DOCUMENTS

| | | | |
|---|---|---|---|
| 3,885,964 | 5/1975 | Nacci | 430/328 |
| 4,050,942 | 9/1977 | Nacci | 430/328 |
| 4,058,400 | 11/1977 | Crivello | 96/86 P |
| 4,058,401 | 11/1977 | Crivello | 96/115 R |
| 4,161,405 | 7/1979 | Crivello | 430/330 |
| 4,175,963 | 11/1979 | Crivello | 430/330 |
| 4,193,799 | 3/1980 | Crivello | 430/281 |
| 4,288,527 | 9/1981 | Morgan | 430/288 |
| 4,291,118 | 9/1981 | Boduck et al. | 430/313 |
| 4,299,938 | 11/1981 | Green et al. | 526/192 |
| 4,307,177 | 12/1981 | Crivello | 430/281 |
| 4,317,858 | 3/1982 | Sattler | 428/379 |
| 4,339,567 | 7/1982 | Green et al. | 528/102 |
| 4,352,723 | 10/1982 | Morgan | 204/159.19 |
| 4,358,477 | 11/1982 | Noomen et al. | 427/541 |
| 4,383,025 | 5/1983 | Green et al. | 430/280 |
| 4,383,903 | 5/1983 | Ayano et al. | 204/159 |
| 4,389,482 | 6/1983 | Bargon et al. | 430/330 |
| 4,413,052 | 11/1983 | Green et al. | 430/327 |
| 4,416,975 | 11/1983 | Green et al. | 430/327 |

OTHER PUBLICATIONS

Beringer and Bodlaender, J. Org. Chem., 1968, 33 2981–2984.

*Primary Examiner*—Jack P. Brammer
*Attorney, Agent, or Firm*—Harry Falber

[57] ABSTRACT

A layer of a liquid composition containing (A) a compound containing at least one heat-polymerizable, ethylenically-unsaturated group, (B) a photopolymerizable material, and (C) a thermally-activated free radical initiator for polymerization of (A), is heated to solidify the layer, and subsequently it is exposed to actinic radiation in a predetermined pattern and those parts of the layer that have not become photopolymerized are removed by treatment with a suitable solvent.

An example of an unsaturated, heat polymerizable compound (A) is butanediol dimethacrylate. An example of a photopolymerizable material (B) is an epoxidized novolak of 2,2-bis(4-hydroxyphenyl)propane with triphenylsulfonium hexafluorophosphate. A typical thermally-activated, free radical initiator (C) is cumene hydroperoxide.

The process is suitable for the manufacture of printing plates and printed circuits.

19 Claims, No Drawings

PROCESS FOR THE PRODUCTION OF IMAGES

This invention relates to a process for the production of images by heating followed by exposure to actinic radiation.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through a negative whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance is applied to a support and this layer is converted into a substantially solid, non-tacky state, ready for irradiation, without the use of organic solvents. Not only would, in this stage, the use be avoided of solvents which might present problems of toxicity and flammability and also cause expense in their recovery, but the production on a continuous basic of coated supports, ready for irradiation, would be facilitated.

We have found that this object can be achieved by the use of certain liquid compositions which contain groups through which thermal polymerisation and photopolymerisation can occur. The groups are chosen so that thermal polymerisation of a layer of the liquid composition occurs rapidly to form a solid, essentially tack-free layer, which is, however, still soluble in certain solvents. When desired, a part or parts of the layer are subjected to actinic radiation and photopolymerisation takes place in the already thermally polymerised layer, the parts of the layer which undergo photopolymerisation becoming much more resistant to solution in the solvent.

U.S. Pat. No. 4,291,118 relates to a method for forming relief images from a film of a liquid photopolymerisable material, comprising exposing the film to chemical hardening treatment sufficient to solidify it, then treating the solidified film in a pattern in a manner differentiating the chemical condition of the film in the pattern as distinct from the chemical condition of the solidified mass not in the pattern, and then selectively removing the portion of the mass in one of the chemical conditions leaving that portion of the mass in the other chemical condition to form a relief image. To bring about the differentiation in chemical condition actinic radiation is used in all the embodiments described, although the disclosure contains the remark "Heat could also by extension be used".

In the process described in U.S. patent, therefore, the film of liquid material is exposed to actinic radiation and then the solidified film is re-exposed to actinic radiation in the form of a pattern so that a part or parts of it become less easily removed by a solvent, and finally the image is developed by washing away with the solvent the more readily removed part or parts, i.e., those which were not re-exposed.

The conditions of exposure have to be carefully controlled; if the first exposure is insufficient, the solidified material remains tacky and inconvenient to handle whereas if it is excessive, images of poor definition are obtained.

Only the use of photopolymerisable polyene-polythiol compositions is described. These have the disadvantage that the polymerisation which is initiated on exposure to heat or actinic radiation continues when such exposure is interrupted. It follows that if images of good quality are to be obtained the imagewise irradiation stage must be performed without delay. This is a constraint on industrial utilisation of the process.

U.S. Pat. Nos. 4,288,527 and 4,352,723 describe acrylate compositions that are cured by both ultraviolet radiation and heat, in either order or simultaneously to form solid products suitable for use as coatings, gaskets, sealants, resists and the like. The compositions may contain a catalytic amount of a pinacol, a photoinitiator and, optionally, a copolymerisable monomer or reactive diluent. These patents do not disclose a process in which a liquid composition is first solidified by heat polymerisation and then an image is formed by selective UV irradiation.

These patents further do not disclose a process in which there may be a delay between the heating stage and the UV irradiation stage with no loss of image quality.

It has now been found that the disadvantages of the prior art processes can be overcome by the use of compositions containing both ethylenic groups and photopolymerisable groups on the same or different molecules.

It has been known for many years that polymers containing pendant photopolymerisable groups can be prepared by free radical-initiated thermal polymerisation of acrylates containing photopolymerisable groups. The solid polymers are usually prepared as solutions in volatile organic solvents and films are formed on substrates such as copper-clad laminates by coating them with such solutions and then evaporating the solvents. The need for an image-forming process which avoids the evaporation of organic solvents but which permits an image-bearing transparency to be placed in contact with the photopolymerisable material is illustrated by U.S. Pat. No. 4,291,118 described above, although the process proposed in that patent is disadvantageous for the reasons we have given.

Despite the need illustrated by that U.S. patent and although the preparation of photopolymerisable polymers from acrylates has been known for many years, we believe it has never been suggested that the sought-after process might have as its basis the thermal polymerisation, on the substrate on which the image is to be produced, of a liquid acrylate containing a photopolymerisable residue to produce a solid layer which is still imagewise photopolymerisable. We have now surprisingly found that a liquid composition containing an acrylate group or other thermally polymerisable unsaturated group and a photopolymerisable group in the same or different molecules can be thermally polymerised on a carrier such as a copper-clad laminate, without the need to use a volatile organic solvent, to form a solid but still curable layer which can then be exposed imagewise to actinic radiation to cure the exposed areas, leaving the unexposed areas soluble in a developer.

One aspect of this invention accordingly provides a process for the production of an image which comprises (i) heating a layer, supported on a carrier, of a liquid composition containing (A) a compound containing at least one heat-polymerisable, ethylenically unsaturated group, (B) a photopolymerisable material, and (C) a thermally activated free radical initiator for polymerisation of (A)

at a temperature at which the initiator (C) is activated, thereby polymerising the material (A) through the heat-polymerisable ethylenically unsaturated group or groups thereof such that the layer solidifies but remains photopolymerisable, and subsequently (ii) exposing the solidified layer to actinic radiation in a predetermined pattern such that exposed parts of the layer are photopolymerised and (iii) removing those parts of the layer which have not become substantially photopolymerised by treatment with a solvent therefor.

The phrase "exposing in a predetermined pattern" includes both exposure through an image-bearing transparency and exposure to a laser beam moved as directed by a computer to form an image.

The liquid composition used in accordance with the present invention may comprise a mixture of one or more substances (A) which are heat-polymerisable with one or more substances (B) which are exclusively photopolymerisable. Alternatively, it may comprise one or more "dual-functional substances", that is, substances which are both heat-polymerisable and photopolymerisable, especially substances having in the same molecule one or more ethylenically unsaturated groups which are heat-polymerisable and one or more groups which are exclusively photopolymerisable; in this embodiment (A) and (B) are the same. In a further alternative, the composition may comprise a mixture of one or more such dual-functional substances with one or more heat-polymerisable substances and/or one or more exclusively photopolymerisable substances.

The first stage of the process is usually carried out by heating the composition at a temperature of from 80° C. to 150° C., preferably 100° C. to 120° C., for up to 50 minutes, preferably for 2 to 30 mins. It is therefore generally desirable that the heat-polymerisable compound (A) and the photopolymerisable material (B) each have a boiling point above 100° C., preferably above 120° C., and especially above 150° C. at atmospheric pressure in order to avoid a marked loss of material during the heating stage.

The unsaturated group or groups in (A) may be aliphatic or cycloaliphatic, and may be attached to saturated or unsaturated aliphatic carbon, aromatic carbon, or oxygen atoms, or carbonyl group. Suitable such materials include styrenes, allylic compounds, cyclohexenes, and acrylic esters.

Preferred heat-polymerisable materials (A) are:

(a) optionally substituted styrenes of formula

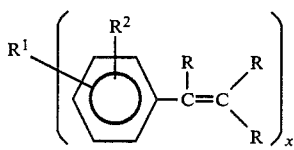

I where each group R is independently a hydrogen atom or an alkyl group having from 1 to 4 carbon atoms, x represents 1 or 2, and when x represents 1, $R^1$ represents a hydrogen atom or an alkyl group having from 1 to 4 carbon atoms, when x represents 2, $R^1$ represents an alkylene group having from 1 to 4 carbon atoms, an oxygen or sulphur atom, or a carbonyl or sulphonyl group, and $R^2$ represents a hydrogen or halogen atom, an alkyl group having from 1 to 6 carbon atoms, a hydroxy group or a glycidyloxy group or the residue of a glycidyloxy group that has been reacted with a phenol or a carboxylic acid, (b) allylic compounds of formula

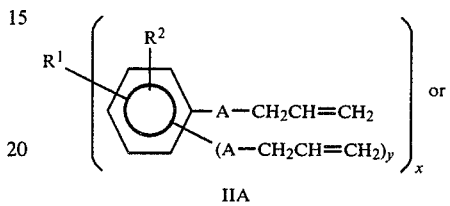

IIA

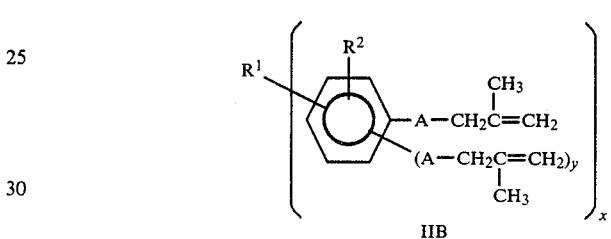

IIB where $R^1$, $R^2$, and x are as hereinbefore defined, y denotes 0 or 1, and A represents a covalent bond, an oxygen atom, or a carbonyloxy group, (c) cyclohexenes of formula

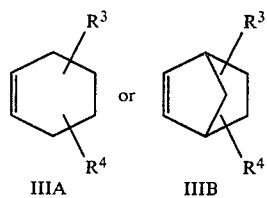

IIIA    IIIB where $R^3$ and $R^4$ are each independently a hydrogen atom, a halogen atom, an alkyl group of from 1 to 6 carbon atoms, a carboxyl group, or an ester group of from 3 to 10 carbon atoms, optionally containing an epoxide group, and (d) acrylic esters containing at least one group of formula

IV where $R^5$ represents a hydrogen, chlorine, or bromine atom or an alkyl group of from 1 to 4 carbon atoms.

Suitable styrenes of formula I include styrene, α-methylstyrene, β-methylstyrene, 4-bromostyrene, 4-methylstyrene, 4-vinylphenol, 1-propenyl-substituted bisphenols such as 2,2-bis(4-hydroxy-3(1-propenyl)-phenyl)propane, and 1-propenyl-substituted bisphenol diglycidyl ethers such as 2,2-bis(4-glycidyloxy-3(1-propenyl)phenyl)propane.

Suitable allylic compounds of formula IIA or IIB include allyl- and methallyl-substituted monohydric phenols, allyl- and methallyl-substituted bisphenols such as 2,2-bis(4-hydroxy-3-(2-propenyl)phenyl)propane, allyl- and methallyl-substituted bisphenol diglycidyl ethers such as 2,2-bis(4-glycidyloxy-3-(2-propenyl)phenyl)propane, allyl and methallyl ethers of monohydric phenols and bisphenols, and allyl and methallyl esters of aromatic carboxylic acids, especially those of di- and other polycarboxylic acids, such as diallyl phthalate and diallyl, dimethallyl, tetraallyl and tetramethallyl esters of benzophenone-3,4,3',4'-tetracarboxylic acid.

Suitable acrylic esters having at least one group of formula IV are acrylates and 2-substituted acrylates of monohydric alcohols such as 2-methoxyethanol, 2-cyanoethanol, furfuryl alcohol, glycidol, and cyclohexanol, and full or partial esters of polyhydric alcohols such as butane diol, pentaerythritol, dipentaerythritol, tri- and tetra-ethylene glycols, trimethylolpropane and glycerol. Also suitable are esters formed by reaction of an alkylene oxide, particularly ethylene oxide or propylene oxide, with an acrylic acid, typically 2-hydroxyethyl and 2-hydroxypropyl acrylates and methacrylates. There may also be used esters formed by reaction of a compound containing one or more glycidyl groups, especially a mono- or polyglycidyl ether of a mono- or polyhydric alcohol or phenol or a N-glycidylhydantoin, with acrylic or methacrylic acid. Other suitable compounds are esters formed by reaction of a diepoxide with an adduct of a hydroxyalkyl acrylate or 2-substituted acrylate with a saturated or unsaturated dicarboxylic acid anhydride such as succinic, maleic, or phthalic anhydride.

Other suitable acrylates include acrylic urethanes, prepared by reaction of an aromatic or aliphatic mono- or poly-isocyanate with a hydroxyalkyl acrylate, and acrylate amines prepared by esterification of a tertiary aminoalcohol or aminophenol with an acrylic acid, especially by reaction of a tertiary aminoalkanol with acrylic or methacrylic acid.

Exclusively photopolymerisable materials (B) which may be used in accordance with the present invention may be those in which polymerisation is effected by direct activation of photosensitive groups through irradiation or those in which the irradiation activates a suitable initiator molecule which then activates polymerisable groups.

Materials having photosensitive groups are well known and include those having at least two, and preferably three or more, groups which are azido, coumarin, stilbene, maleimido, pyridinone, chalcone, propenone, pentadienone, anthracene, or acrylic ester groups which are substituted in their 3-position by a group having ethylenic unsaturation or aromaticity in conjugation with the ethylenic double bond of the acrylic group.

Materials in which photopolymerisation is effected by activation of a photoinitiator which then activates polymerisable groups include epoxide resins, phenolic resins, urea-formaldehyde resins, cyclic ethers, cyclic esters, cyclic sulphides, cyclic amines and organosilicon cyclics in combination with a radiation-sensitive aromatic 'onium salt, such as diazonium, sulphonium, iodonium, and sulphoxonium salts, or a radiation-sensitive aromatic iodosyl salt.

Examples of suitable azides are those containing at least two groups of formula $$N_3Ar— \qquad V$$

where Ar denotes a mononuclear or dinuclear divalent aromatic radical containing in all from 6 to at most 14 carbon atoms, especially a phenylene or naphthylene group.

Examples of suitable coumarins are those containing groups of the formula

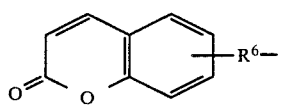

VI where $R^6$ is an oxygen atom, a carbonyloxy group (—COO—), a sulphonyl group, or a sulphonyloxy group.

Examples of those containing stilbene groups are those containing groups of the formula

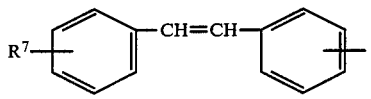

VII where $R^7$ is the residue, containing up to 8 carbon atoms in all, of a five or six-membered nitrogen-containing heterocyclic ring, fused to a benzene or naphthalene nucleus, and linked through a carbon atom of the said heterocyclic ring adjacent to a nitrogen hetero atom thereof to the indicated benzene nucleus, such as a benzimidazolyl, benzoxazolyl, benzotriazolyl, benzothiazolyl, or a naphthotriazolyl residue.

Examples of those containing maleimide units are those having groups of the formula

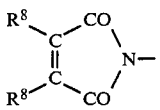

VIII where each $R^8$ is an alkyl group of 1 to 4 carbon atoms, a chlorine atom, or a phenyl group, and especially a methyl group.

Examples of those containing pyridinone units are those having groups of the formula

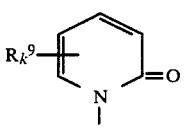

IX where
$R^9$ is an aliphatic or cycloaliphatic radical of 1 to 8 carbon atoms and
k is zero or an integer of 1 to 4.

Examples of compounds containing chalcone, propenone, and pentadienone groups are those containing groups of formula

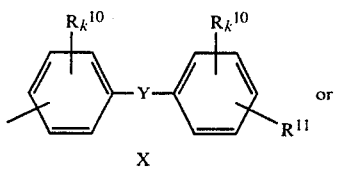

X

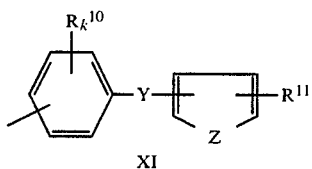

XI where
each $R^{10}$ is a halogen atom, or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing 1 to 9 carbon atoms, or is a nitro group, or a carboxyl, sulphonic, or phosphoric acid group in the form of a salt, k has the meaning previously assigned, $R^{11}$ represents a valency bond or a hydrogen atom, Y represents a grouping of formula

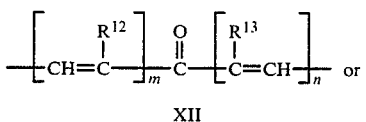

XII

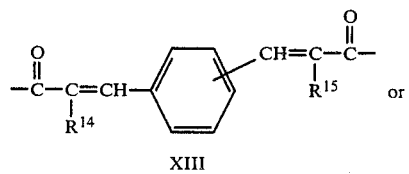

XIII

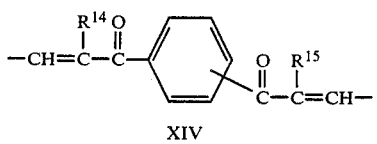

XIV $R^{12}$ and $R^{13}$ are each individually a hydrogen atom, an alkyl group, e.g. of 1 to 4 carbon atoms, or an aryl group, preferably a mononuclear group such as a phenyl group, or $R^{12}$ and $R^{13}$ conjointly denote a polymethylene chain of 2 to 4 methylene groups, $R^{14}$ and $R^{15}$ are each a hydrogen atom, an alkyl group, e.g., of 1 to 4 carbon atoms, or an aryl group which is preferably a mononuclear group such as a phenyl group, m and n are each zero, 1, or 2, with the proviso that they are not both zero, and Z is an oxygen or sulphur atom.

Suitable anthracenes are those containing anthryl groups, such as 1-, 2-, or 9-anthryl groups, which are unsubstituted or have one or two bromo, chloro, methyl or nitro substituents.

Suitable 3-substituted acrylates contain groups of the general formula $R^{16}CH\!=\!C(R^5)COO-$  XV where
$R^{16}$ is an aliphatic or mononuclear aromatic, araliphatic, or heterocyclic group which, as already indicated, has ethylenic unsaturation or aromaticity in conjugation with the ethylenic double bond shown, such as phenyl, 2-furyl, 2- or 3-pyridyl, prop-2-enyl, or styryl groups, and $R^5$ has the meaning previously assigned.

Specific examples are disorbates of poly(oxyalkylene)glycols, polyvinyl cinnamate and epoxide resin-cinnamic acid reaction products.

Onium salts which, when combined with an epoxide resin or other cationically polymerisable substance, give photopolymerisable mixtures, are described in U.S. Pat. Nos. 4,058,400 and 4,058,401. Suitable sulphoxonium salts that may be used for the same purpose are disclosed in U.S. Pat. No. 4,299,938, and in European Patent Application Nos. EP-A-35969 and EP-A-44274.

Suitable aromatic iodosyl salts which, when combined with a cationically polymerisable substance, give a photopolymerisable mixture, are those of formula $((Ar^1)(Ar^2)I+O)_tX^{t-}$, where $Ar^1$ and $Ar^2$, which can be the same or different, each represent a monovalent aromatic radical of 4 to 25 carbon atoms, $X^{t-}$ denotes a t-valent anion of a protic acid, and
t denotes 1, 2 or 3.

Preferably $Ar^1$ and $Ar^2$ are each phenyl, optionally substituted on each of the phenyl rings by an alkyl group of 1 to 4 carbon atoms, a halogen atom or a nitro group, The anion $X^{t-}$ is selected to give effective curing. Matching a cationically polymerisable material with a suitable anion is well within the knowledge of those skilled in the art of curing or polymerising cationically polymerisable compositions. For example, salts containing anions derived from organic carboxylic acids, organic sulphonic acids, and inorganic acids, especially acetates, trifluoroacetates, methanesulphonates, benzenesulphonates, toluene-p-sulphonates, trifluoromethanesulphonates, fluorides, chlorides, bromides, iodates, perchlorates, nitrates, sulphates, hydrogen sulphates, phosphates or hydrogen phosphates are useful in curing phenoplasts, such as phenol-formaldehyde resins, and aminoplasts, such as urea-formaldehyde resins. Salts containing a pentafluorohydroxoantimonate anion or a metal halogenide or metalloid halogenide anion of formula $MQ_w^-$, where M represents an atom of a metal or metalloid, Q represents a halogen atom, w is an integer of from 4 to 6 and is one more than the valency of M, are useful in curing epoxide resins or episulphide resins.

Preferred anions of formula $MQ_w^-$ are hexafluoroantimonate, hexachloroantimonate, hexafluoroarsenate, tetrachloroferrate, hexachlorostannate, tetrafluoroborate or hexafluorophosphate, the two last-named being especially preferred.

The diaryliodosyl salts may be prepared by methods similar to, or analogous to, those described by F. M. Beringer and P. Bodlaender, J. Org. Chem. 1968, 33, 2981-4.

Suitable dual-functional materials which may be used in the process of the present invention contain one or more ethylenically unsaturated groups which will polymerise under the conditions used in stage (i) of the process and also one or more photopolymerisable groups, as previously described, which will polymerise when irradiated or when activated by an irradiated molecule. Such materials may be made by introducing one or more ethylenically unsaturated, especially acrylic ester, groups into a compound which already contains one or more photopolymerisable groups and also one or more reactive groups such as carboxylic acid, phenolic or alcoholic hydroxy, epoxide, or imido groups. Preferred materials are those containing one or more acrylic ester groups, that is one or more groups of formula IV, and one or more groups of formula V, VI, VIII, X, XI or XV, or one or more anthracene or epoxide groups.

Examples of classes of compounds containing a photopolymerisable group and also a carboxylic acid group are azidoaromatic acids; carboxyl-substituted stilbene derivatives such as stilbenebenzimidazoles, stilbenebenzoxazoles, stilbenebenzotriazoles, stilbenenaphthotriazoles, and stilbenebenzothiazoles; carboxyl-containing maleimides, where the two ethylenic carbon atoms of the maleimide ring are substituted by alkyl groups of 1 to 4 carbn atoms, phenyl groups, or chlorine atoms; anthracene carboxylic acids; and also acrylic acids substituted in the 3-position by groups having ethylenic unsaturation or aromaticity in conjugation with the ethylenic double bond in the 2,3-position.

Examples of classes of compound containing a photopolymerisable group and also a phenolic hydroxyl group are hydroxy-substituted chalcones and anthracenes and hydroxyphenyl-substituted propenones and pentadienones. Examples of classes of compounds containing a photopolymerisable group and also an alcoholic hydroxyl group are hydroxy-substituted maleimides, hydroxy-substituted pyridinones and anthryl-substituted alcohols. Such hydroxyl group-containing compounds may be reacted directly with the ethylenically unsaturated compound (containing a hydroxyl-reactive group) or they may first be converted into their glycidyl ethers, and these ethers then reacted with the ethylenically unsaturated compound.

Examples of classes of compounds containing a photopolymerisable group and an imido group are disubstituted maleimides, where the two ethylenic carbon atoms of the maleimide ring are substituted as specified above.

Suitable azidoaromatic acids are 4-azidobenzoic acid and other compounds of formula N₃—Ar—COOH      XVI where Ar has the meaning previously assigned.

Suitable carboxyl-containing stilbene derivatives are 4-(1-methylbenzimidazol-2-yl)stilbene-4'-carboxylic acid, 4-(2H-naphtho[1,2-d]triazol-2-yl)-stilbene-4'-carboxylic acid, and other compounds of the general formula

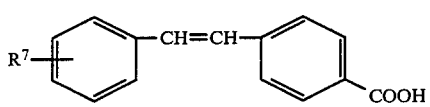

XVII where $R^7$ has the meaning previously assigned.

Suitable carboxyl-containing maleimides are N-(carboxyphenyl)dimethylmaleimide and other compounds of the general formula

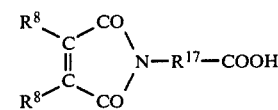

XVIII where
each $R^8$ has the meaning previously assigned and
$R^{17}$ denotes the residue, containing up to 14 carbon atoms, of an aromatic, aliphatic, or cycloaliphatic aminocarboxylic acid after removal of a primary amino group and a carboxylic acid group.

Suitable hydroxy-substituted chalcones and hydroxyphenyl-substituted propenones and pentadienones are 1-(4-hydroxyphenyl)-3-oxo-3-phenylprop-1-ene, 1-(4-hydroxyphenyl)-1-oxo-3-phenylprop-2-ene, 1-(2-furyl)-3-oxo-3-(4-hydroxyphenyl)prop-1-ene, and other compounds of the general formula

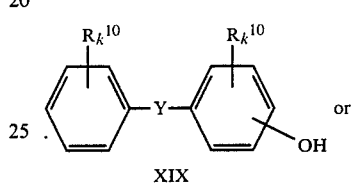

XIX

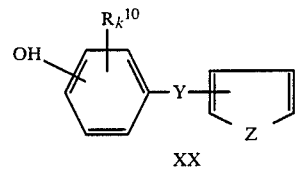

XX where each $R^{10}$, k, Y, and Z have the meanings previously assigned.

Suitable hydroxy-substituted maleimides and hydroxy-substituted pyridinones are N-(2-hydroxyethyl)-dimethylmaleimide, 4,6-dimethyl-1-(2-hydroxyethyl)-pyridin-2-one, and other compounds of the general formula

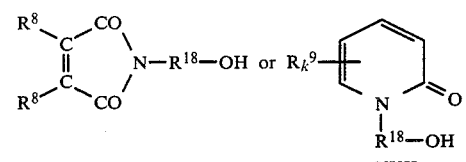

XXI      XXII where
each $R^8$, $R^9$, and k have the meaning previously assigned and
$R^{18}$ denotes the residue, of not more than 8 carbon atoms, of an aliphatic or cycloaliphatic aminoalcohol after removal of an amino group and an alcoholic hydroxyl group.

Suitable imides are dimethylmaleimide and other compounds of the general formula

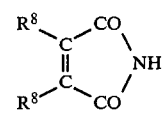

XXIII where each $R^8$ has the meaning previously assigned.

Suitable anthracene-containing carboxylic acids are anthracene-1-carboxylic acid, anthracene-2-carboxylic acid and anthracene-9-carboxylic acid. Suitable hydroxy-substituted anthracenes are 1-anthranol and 2-anthranol. Suitable anthryl-substituted alcohols are 1-hydroxymethylanthracene, 9-hydroxymethylanthracene and 1-(2-anthryl)ethanol.

Suitable 3-substituted acrylic acids are cinnamic acid and other acids of formula

$$R^{16}CH=C(R^5)COOH \qquad XXIV$$

where $R^5$ and $R^{16}$ have the meanings previously assigned.

The ethylenically unsaturated group or groups may be introduced into such compounds by known methods, for example by esterification using an ethylenically unsaturated acid such as an acrylic acid or a reactive derivative of such an acid, for example glycidyl methacrylate, or an ethylenically unsaturated alcohol such as hydroxyethyl methacrylate.

Other suitable dual-functional materials include those having one or more heat-polymerisable ethylenically unsaturated groups and one or more epoxide groups, in the presence of a radiation-sensitive aromatic 'onium or iodosyl salt. Thus, in the presence of such a salt, the styrenes of formula I and the allylic compounds of formula IIA or IIB, where $R^2$ is a glycidyloxy group, and the cyclohexenes of formula IIIA or IIIB where $R^3$ and/or $R^4$ contain an epoxide group, may be used as dual-functional materials.

Further substances which, in the presence of a radiation-sensitive aromatic 'onium or iodosyl salt, may be used as dual-functional materials are those containing both an epoxide group and an acrylic ester group, especially those of formula

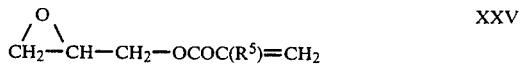

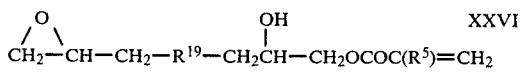

and

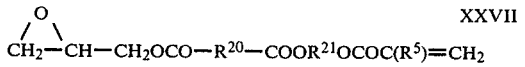

where
$R^5$ is as hereinbefore defined,
$R^{19}$ represents the residue of a polyglycidyl compound after the removal of two glycidyl groups,
$R^{20}$ represents the residue of a polycarboxylic acid after the removal of two carboxylic acid groups, and
$R^{21}$ represents an alkylene chain of from 1 to 6 carbon atoms.

Suitable such residues $R^{19}$ include dihydric phenol, especially bisphenol, residues after removal of the two phenolic hydrogen atoms, glycol residues after removal of the two alcoholic hydrogen atoms, and hydantoin residues after removal of the two amidic hydrogen atoms. Suitable residues $R^{20}$ are saturated or unsaturated aliphatic or aromatic dicarboxylic acid residues and aromatic tri- or tetracarboxylic acid residues, after removal of two carboxylic acid groups, such as succinic, malonic, maleic, phthalic, trimellitic and pyromellitic acid residues. Suitable alkylene groups $R^{21}$ are ethylene, propylene, and butylene groups.

It will be apparent that the compounds of formulae XXV to XXVII include compounds already suggested above for use as heat-polymerisable materials. In the absence of a radiation-sensitive cationic catalyst such as an aromatic 'onium or iodosyl salt, the epoxide groups of such compounds are not photopolymerisable.

Suitable compounds of formulae XXV to XXVII may be made by introducing a group of formula IV, especially an acrylate or methacrylate group, into a compound which already contains one or more 1,2-epoxide groups or, conversely, by introducing one or more 1,2-epoxide groups into a compound that already contains one or more groups of formula IV.

A convenient method of introducing groups of formula IV into a compound that already contains epoxide groups to produce, for example, a compound of formula XXVI comprises reaction of an at least diepoxide with a stoichiometric deficit, based on the epoxide group content, of a compound containing both a group of formula IV and also a group, such as a carboxylic acid, phenolic or alcoholic hydroxyl, or imido group, capable of reaction with a 1,2-epoxide group so as to introduce at least one group of formula IV into the molecule. Suitable polyepoxides include polyglycidyl esters of polycarboxylic acids such as succinic acid, polyglycidyl ethers of polyhydric alcohols such as butane-1,4-diol and polyhydric phenols such as 2,2-bis(4-hydroxyphenyl)propane and poly(N-glycidyl) compounds such as N,N'-diglycidylhydantoins. It will be understood that this method will not usually give rise to a 100% yield of material containing, on the same molecule, both a 1,2-epoxide group and an acrylate group of formula IV. The other material in the product comprises a mixture of unchanged starting material containing the original number of epoxide groups, and material in which all epoxide groups have been replaced by groups of formula IV. However, since such mixtures may be successfully used in the present process, the fact that the reaction product is a mixture is of no consequence.

A convenient method of introducing one or more epoxide groups into a compound having at least one group of formula IV, to produce, for example, a compound of formula XXV, comprises using as the latter a compound which has also at least one alcoholic hydroxyl, or a carboxyl, group, and treating it such that the group or groups is or are converted into 1,2-epoxide groups, using methods known in the art of epoxide resins for converting hydroxyl or carboxyl groups into glycidyl ether or ester groups. For example, the compound is caused to react with epichlorohydrin in the presence of a hydrogen chloride acceptor (usually a strong base, e.g., NaOH) and preferably of a catalyst such as a quaternary ammonium compound, a tertiary amine, a transition metal salt, a thioether, or a sulphonium salt. Usually an excess of epichlorohydrin over the theoretical quantity required is employed, the excess serving as solvent for the reaction, which is normally carried out at a temperature of 30° to 120° C., preferably 40° to 65° C., and usually under reduced pressure in order to remove the water formed during the reaction.

A convenient method of making compounds such as those of formula XXVII comprises converting a hydroxy-substituted compound containing a group of formula IV into a partial ester by reaction with a polycarboxylic acid anhydride. The free carboxylic acid group(s) may then be glycidylated, following the method outlined above, or may be esterified by treatment with a compound containing two or more epoxide groups, usually at 60° to 120° C. in the presence of a strong base and a catalyst such as a quaternary ammonium compound, or a transition metal salt.

Typical compounds of formulae XXV to XXVII are glycidyl acrylate, glycidyl methacrylate, 2-(4-glycidyloxyphenyl)-2-(4-(3-acryloyloxy-2-hydroxypropoxy)phenyl)propane, 2-(4-glycidyloxyphenyl)-2-(4-(2-hydroxy-3-methacryloyloxy)propoxy)phenyl)propane, 1-(2-methacryloyloxyethoxycarbonyl)-2,4- and 2,5-bis(glycidyloxycarbonyl)benzene, 1-(2-acryloyloxyethoxycarbonyl)-2,4- and 2,5-bis(glycidyloxycarbonyl)benzene, 2-acryloyloxyethoxy glycidyl succinate, 2-methacryloyloxyethoxy glycidyl succinate, 1-glycidyl-3-(3-acryloyloxy-2-hydroxypropyl)-5,5-dimethylhydantoin, 1-glycidyl-3-(2-hydroxy-3-methacryloyloxypropyl)-5,5-dimethylhydantoin, 1-glycidyloxy-4-(3-acryloyloxy-2-hydroxypropyloxy)butane, and 1-glycidyloxy-4-(2-hydroxy-3-methacryloyloxypropyloxy)butane.

Photopolymerisation may be effected by radiation in the presence of a photosensitiser such as 5-nitroacenaphthene, 4-nitroaniline, 2,4,7-trinitro-9-fluorenone, 3-methyl-1,3-diaza-1,9-benzanthrone, bis(-dialkylamino)benzophenones, especially Michler's ketone, i.e., bis(p-dimethylamino)benzophenone, and 2-chlorothioxanthone.

Generally 0.1 to 20%, and preferably 0.5 to 15%, by weight of the photopolymerisation catalyst is incorporated, based on the weight of photopolymerisable substance.

Especially preferred photopolymerisable materials used in accordance with this invention, are mixtures of an epoxide resin, i.e. a compound containing, on average, more than one 1,2-epoxide group, and an aryl 'onium hexafluorophosphate or iodosyl hexafluorophosphate. Such mixtures do not require the addition of a photosensitiser to aid photocuring of the resin.

The thermally-activated free radical initiator (C) may be any material that liberates a free radical when heated under the conditions used in stage (i) of the process of this invention. Suitable free radical initiators are well known and include organic peroxides and hydroperoxides, azo compounds, and sterically crowded phenyl substituted alkanes, such s 2,3-dimethyl-2,3-diphenylbutane and 3,4-dimethyl-3,4-diphenylhexane. The preferred free radical initiators are azobis(isobutyronitrile), cumene hydroperoxide, and ketone peroxides, especially cyclohexanone peroxide and ethylmethylketone peroxide. An aromatic iodosyl salt may also be used as the initiator (C). Thus, in compositions containing a cationically polymerisable material, such an iodosyl salt can serve as both the initiator (C) and as cationic photopolymerisation catalyst. Suitable iodosyl salts are described above. Accelerators of free radical polymerisation, such as sulphimides, transition metal salts and tertiary amines, may be used together with (C).

Suitable carriers on which the liquid compositions may be polymerised in accordance with this invention are metals, particularly copper and aluminium, fibre reinforced composites, optionally faced with a metal, and silicon wafers.

In the second stage of the process, actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual compounds used, the proportion of these compounds in the composition, the type of light source, and its distance from the composition. Suitable times may be readily determined by those familiar with photopolymerisation techniques.

After irradiation, those parts not exposed are washed away by means of a solvent such as cyclohexanone, 2-ethoxyethanol, toluene, acetone, and mixtures thereof and aqueous acids and bases such as dilute hydrochloric acid, aqueous sodium carbonate or sodium hydroxide. Thus, the compositions of this invention may be used in the production of printing plates and printed circuits. Methods of producing printing plates and printed circuits from photopolymerisable compositions are well known.

The following Examples illustrate the invention. All parts and percentages are by weight.

Resins used in the Examples are prepared as follows:

RESIN 1

A mixture containing trimellitic anhydride (192 g), 2-hydroxyethyl methacrylate (130 g), tetramethylammonium chloride (1 g) and hydroquinone (0.3 g) is heated in a reaction vessel for 2 hours at 60° C. by which time no anhydride remains.

To the mixture is added epichlorohydrin (185 g) and then it is reheated to 90° C. for a further 2 hours, by which time the epoxide content has fallen to zero.

A further amount of epichlorohydrin (925 g) is added, and the reaction is set to reflux at 55°–57° C., under a Dean and Stark trap under reduced pressure. To this is added a solution of sodium hydroxide (88 g) in water (88 g) over a period of 2 hours and the reflux is maintained for a further 1½ hours. A total of 124 g of water is collected during this reflux.

The mixture is then cooled, filtered, washed with 200 ml of 10% sodium dihydrogen orthophosphate, and finally twice with 500 ml of water. After drying with magnesium sulphate, which is removed by filtering, the excess epichlorohydrin is removed under reduced pressure whilst heating to 100° C. in a rotary evaporator. The epoxide content of the final product is 3.36 eq/kg (73% of theory).

RESIN 2

This denotes an epoxidised novolak of 2,2-bis(4-hydroxyphenyl)propane, having a softening point of around 72° C. and an epoxide content of 4.7 eq/kg.

RESIN 3

1,5-bis(4-hyroxyphenyl)penta-1,4-dien-3-one ( 58.5 parts), 1,3-diglycidyl-5,5-pentamethylene hydantoin (51.6 parts), 2-hydroxyethyl methacrylate (110.1 parts) and tetramethylammonium bromide (0.3 parts) are heated together for 9 hours at 100° C. A further amount of tetramethylammonium bromide (0.3 part) is added and the heating is continued for a further 6 hours, by which time the epoxide value is 0.14 equivalents/kg. The epoxide content is reduced to a negligible value by adding acrylic acid (2.5 parts) and heating for a further 1½ hours at 100° C.

RESIN 4

Glycidyl methacrylate (50 parts) and tetramethylammonium chloride (0.3 part) are heated to 100° C. 4-Hydroxycinnamic acid (50 parts) is added and the mixture is stirred whilst the temperature is maintained at 100° C. for 4½ hours. The epoxide content is reduced to 0.15 eq/kg in this time. Hydroxyethylmethacrylate (15 parts) is added and the mixture is allowed to cool to ambient temperature.

RESIN 5

Glycidyl methacrylate (50 parts), 7-hydroxycoumarin (50 parts) and tetramethylammonium chloride (0.3 parts) are stirred and heated at 100° C. for 4 hours by which time the epoxide value is 0.2 eq/kg. The resin is allowed to cool.

RESIN 6

A solid epoxide resin prepared from 2,2-bis(4-hydroxyphenyl)propane, having an epoxide content of 1.5 eq/kg and a softening point of 73°-79° C. is heated at 120° C. for 3 hours with 1 equivalent (calculated on epoxide content) of acrylic acid in the presence of 5% chromium octanoate and 0.2% 2,6-di-tert.butyl-4-methylphenol. The product has a negligible epoxide content (below 0.2 eq/kg.)

RESIN 7

This denotes 2,2-bis[4-glycidyloxy-3-(1-propenyl)-phenyl]propane, having an epoxide content of 4.19 equiv./kg.

RESIN 8

This denotes 2,2-bis[4-glycidyloxy-3-(2-propenyl)-phenyl]propane having an epoxide content of 4.43 equiv./kg.

RESIN 9

A mixture of 100 g of an epoxidised novolak made from a phenol-formaldehyde novolak of average molecular weight 420 and having an epoxide content of 5.61 eq./kg, 2,6-di-t-butyl-p-cresol (0.2 g) and chromium III trisoctanoate (0.1 g) is heated to 120° C. and cinnamic acid (83 g) added over a period of 1 hour. The mixture is heated for a further 3½ hours at 120° C. and then allowed to cool. The product solidifies at room temperature and has an epoxide content of 0.16 eq./kg.

RESIN 10

2-Hydroxyethyl acrylate (60 g) is added dropwise with stirring to phenyliosocyanate (59 g) and dibutyl tin dilaurate (0.2 g). The mixture is heated at 70° C. until all of the isocyanate has reacted.

RESIN 11

A mixture of 9.9 g of an epoxidised novolak made from a phenol-formaldehyde novolak of average molecular weight 420 and having an epoxide content of 5.61 eq./kg, 2,2-bis(4-hydroxyphenyl)propane (2.3 g), 4-azidobenzoic acid (4.8 g), 2,6-di-t-butyl-p-cresol (0.14 g), tetramethylammonium chloride (0.05 g) and cyclohexanone (40 g) is heated with stirring at 120° C. for 5 hours. The cyclohexanone is then removed by distillation under reduced pressure.

RESIN 12

This denotes a diglycidyl ether prepared by advancing 2,2-bis(4-glycidyloxyphenyl)propane with 2,2-bis(3,5-dibromo-4-hydroxyphenyl)propane. It has a softening point of 50° C. and an epoxide content of 2.0-2.2 equiv./kg.

Diphenyliodosyl hexafluorophosphate is prepared as follows:

To a solution of sodium hydroxide (8 g) in 200 ml of water at 0° C. is added iodoxybenzene (23.6 g). Stirring is maintained at this temperature for 1½ hours. The mixture is filtered and the precipitate removed. A 10% solution of hexafluorophosphoric acid is added to the filtrate until the hydrogen ion concentration reaches $10^{-4}$ ML$^{-1}$. During this time a white precipitate forms; this is collected by filtration, washed with water and dried in air. The white solid is triturated with diethyl ether, collected and redried to give a yield of 60% of diphenyliodosyl hexafluorophoshate, m.pt. 128°-130° C.

EXAMPLE 1

Resin 1 (94 parts), cyclohexanone peroxide (3 parts) and triphenylsulphonium hexafluorophosphate (3 parts) is applied to a copper clad laminate by spin coating, leaving a layer 6-8 μm thick, and heated at 120° C. for 6 minutes. The layer solidifies and is then irradiated through a negative using a 5000 w metal halide lamp at a distance of 75 cm for 1 minute. Development in toluene plus 10% acetone gives an image in which the uncoated layers can be etched using an aqueous solution of iron (III) chloride (40% FeCl$_3$) at 30° C. for 3½ minutes leaving the coated areas intact.

EXAMPLE 2

Resin 1 (94 parts), Trigonox 51 ® (3 parts; a commercial ketone peroxide mixture available from Akzo Chemie U.K. Ltd., Wandsworth, London S.W.18. "Trigonox" is a trade mark), and triphenylsulphonium hexafluorophosphate (3 parts) are mixed and coated by spin coating onto a copper clad laminate leaving a layer 6-8 μm thick. This is heated at 120° C. for 18 minutes to solidify the coating. Irradiation through a negative for 1 minute, using a 5000 w metal halide lamp at a distance of 75 cm gives a sharp image when developed in toluene containing 10% acetone.

EXAMPLE 3

A mixture of Resin 1 (94 parts), cumene hydroperoxide (3 parts) and triphenylsulphonium hexafluorophosphate (3 parts) is applied by spin coating to a copper coated laminate leaving a coating 6-8 μm thick, and the resultant coating is baked in an oven at 120° C. for ten minutes. The resin mixture solidifies and is then irradiated through a negative using a 5000 w metal halide lamp at a distance of 75 cm for 1 minute. Development in toluene containing 10% acetone gives an image which can be etched using an aqueous solution of ferric chloride (40%) at 30° C. for 200 seconds leaving the coated areas intact.

EXAMPLE 4

A mixture of Resin 1 (94 parts), azobis(isobutyronitrile) (3 parts) and bis(p-tolyl)iodonium hexafluorophosphate (3 parts) is applied by spin coating to a copper covered laminate to a thickness of 6-8 μm. The coating is heated in an oven at 120° C. for 30 minutes. The layer solidifies and is then irradiated through a negative using a 5000 w metal halide lamp at a distance of 75 cm for 1½ minutes. Development is toluene containing 10% acetone gives a sharp, glossy image.

EXAMPLE 5

Resin 2 (70 parts), 1,4-butanediol dimethhacrylate (30 parts) cumene hydroperoxide (3 parts) and triphenylsulphonium hexafluorophosphate (3 parts) are coated onto a copper clad laminate using a no. 1K bar, leaving a coating 6 to 8 μm in thickness. The coating is heated in an oven at 120° C. for 6 minutes, during this time the coating solidifies. The coating is irradiated through a negative for two minutes using a 5000 w metal halide lamp at a distance of 75 cm. Development with 1,1,1-trichloroethane gives an image.

EXAMPLE 6

A mixture of Resin 2 (70 parts), 1,4-butanediol dimethyacrylate (30 parts), cyclohexanone peroxide (3 parts) and triphenylsulphonium hexafluorophosphate (3 parts) is applied to a copper clad laminate by spin coating, leaving a layer 6–8 μm thick, and heated at 120° C. for 5 minutes. The layer solidifies and is then exposed through a negative to a 5000 w metal halide lamp at a distance of 75 cm for two minutes. Development in 1,1,1-trichloroethane gives a good image.

EXAMPLE 7

A mixture of Resin 2 (70 parts), 1,4-butanediol dimethacrylate (30 parts), cumene hydroperoxide (3 parts) and bis(p-tolyl)-iodonium hexafluorophosphate (3 parts) is applied to a copper clad laminate by spin coating, leaving a layer 6–8 μm thick, and heated at 120° C. for 7 minutes. The applied coating solidifies and is then exposed through a negative to light from a 5000 w metal halide lamp at a distance of 75 cm for two minutes. A good image is obtained when the coating is developed with 1,1,1-trichloroethane.

EXAMPLE 8

The mixture in Example 7 is used, replacing the cumene hydroperoxide with cyclohexanone peroxide. The coating on the copper clad laminate is heated at 120° C. for 5 minutes and it solidifies. Irradiation of the coating, through a negative using a 5000 w metal halide lamp at a distance of 75 cm for two minutes produces an image which can be developed in 1,1,1-trichloroethane.

EXAMPLE 9

A mixture of 3'-methacryloyloxy-2'-hydroxypropylanthracene-9-carboxylate (67.5 parts), glycidyl methacrylate (27.5 parts) and cyclohexanone peroxide (3 parts) is coated onto a copper clad laminate by spin coating, leaving a layer 20 μm thick. The laminate is heated at 120° C. for ten minutes then allowed to cool. The solidified layer is irradiated through a negative for 1½ minutes using a 5000 w metal halide lamp at a distance of 75 cm. Development with a 1:1 mixture of cyclohexanone:1,1,1-trichloroethane produces a good image.

EXAMPLE 10

A mixture of N-(2-methacryloyloxy)ethyl-2,3-dimethylmaleimide (42 parts), 3-(methacryloyloxy)-2-hyroxypropyl dibromo-p-cresyl ether (42 parts), glycidyl methacrylate (10 parts) and cumene hydroperoxide (5 parts) is applied to a copper clad laminate by spin coating, leaving a layer 6–8 μm thick, and heated at 120° for twenty minutes. The solidified coating is then irradiated through a negative using a 5000 w metal halide lamp at a distance of 75 cm. Development with 1,1,1-trichloroethane produces a clear image.

EXAMPLE 11

A mixture of Resin 3 (100 parts) and cyclohexanone peroxide (3 parts) is applied to a copper coated laminate by spin coating and heated at 120° C. for five minutes. The solidified coating, which is about 20 μm thick, is irradiated through a negative using a 5000 w metal halide lamp at a distance of 75 cm for 2 minutes. Development with 0.5% aqueous sodium hydroxide solution gives an image.

EXAMPLE 12

A mixture of Resin 4 (65 parts), a glycidyl methacrylate (35 parts) and cyclohexanone peroxide (3 parts) is spin coated onto a copper clad laminate to a thickness of 12 μm. The resin layer is solidified by heating in an oven at 120° C. for five minutes. The coating is then irradiated through a negative using a 5000 w metal halide lamp at a distance of 75 cm, for 1½ minutes. Development with toluene and 2% cyclohexanone gives a glossy, sharp image.

EXAMPLE 13

A mixture of Resin 5 (75 parts), glycidyl methacrylate (25 parts) and Trigonox 51 (3 parts) is spin coated onto a copper clad laminate to give a thickness of 12 μm. The coating is solidified by heating in an oven at 120° C. for 7 minutes. The solidified resin is irradiated through a negative using a 5000 w metal halide lamp at a distance of 75 cm for 1½ minutes. Development with toluene and 2% cyclohexanone gives a well defined, glossy image.

EXAMPLE 14

A mixture of 4.2 g of Resin 6, 3.8 g of dipentaerythritol monohydroxypentacrylate, 2.1 g of 1,4-butanedioldimethyacrylate, 0.3 g benzil dimethyl ketal and 0.03 g cyclohexanone peroxide is coated onto a copper clad laminate to give a thickness of about 25 μm. The coated laminate is then heated in an oven at 120° C. for 7 minutes to obtain a tack-free surface. Irradiation of the coating through a negative using a 5000 w metal halide lamp at a distance of 75 cm, then development in toluene, gives a sharp, glossy image.

EXAMPLE 15

A mixture of Resin 7 (20 parts), 4-bromostyrene (20 parts), cyclohexanone peroxide (3 parts), and bis(4-nitrophenyl)iodonium hexafluorophosphate (3 parts) is coated onto a copper clad laminate so that a layer 20 μm thick is formed. The mixture is solidified by heating in an oven at 120° C. for five minutes. Irradiation through a negative using a 5000 w metal halide lamp at a distance of 75 cm produces an image which can be developed in petroleum ether containing 5% xylene.

EXAMPLE 16

A mixture of Resin 8 (100 parts), cyclohexanone peroxide (5 parts) and bis(p-tolyl)iodonium hexafluorophosphate (5 parts) is coated onto a copper clad laminate to a thickness of 15 μm. The layer is solidified by heating in an oven at 120° C. for 25 minutes. Irradiation of the film through a negative for 1½ minutes using a 5000 w metal halide lamp at a distance of 75 cm followed by development in toluene produces an image.

EXAMPLE 17

A mixture of Resin 9 (10 parts), diethylaminoethyl acrylate (5 parts), cumene hydroperoxide (0.6 part), Michler's ketone (0.2 part), and benzoic sulphimide (0.05 part) is coated onto a copper clad laminate to a thickness of 12 μm. The coating is solidified by heating in an oven at 120° C. for 1 minute. Irradiation of the solidified coating through a negative for 2 minutes, using a 5000 w metal halide lamp at a distance of 75 cm, followed by development in ethanol produces an image.

EXAMPLE 18

A mixture of Resin 9 (60 parts), Resin 10 (40 parts), and cyclohexanone peroxide (3 parts) is coated onto a copper clad laminate to a thickness of 10 μm. The coating is solidified by heating in an oven at 120° C. for 10 minutes. Irradiation of the solidified coating for two minutes through a negative, using a 5000 w metal halide lamp at a distance of 75 cm, followed by development in ethanol containing 5% acetone produces an image.

EXAMPLE 19

A mixture of Resin 11 (80 parts), 2-cyanoethyl acrylate (20 parts), cumene hydroperoxide (5 parts) and iron naphthenate (0.1 part) is coated onto a copper clad laminate to a thickness of 12 μm. The coating is solidified by heating in an oven at 100° C. for 3 minutes. Irradiation of the solidified coating through a negative for two minutes, using a 5000 w metal halide lamp at a distance of 75 cm, produces a good clear image when developed in toluene.

EXAMPLE 20

A mixture of Resin 12 (64 parts), diglycidyl 1,2-cyclohex-4-enedicarboxylate (36 parts), cyclohexanone peroxide (3 parts) and triphenylsulphonium hexafluorophosphate (3 parts) is applied to a copper clad laminate to give a layer 15–18 μm thick. The coated laminate is heated in an oven at 120° C. for 10 minutes then allowed to cool, to leave a tack free surface. The coating is irradiated through a negative for 3 minutes using a 5000 w metal halide lamp at a distance of 75 cm and then developed in toluene to leave a sharp hard image.

EXAMPLE 21

A mixture of Resin 12 (6.6 parts), diallyl phthalate (1.6 parts), 4-bromostyrene (1.6 parts), cyclohexanone peroxide (0.3 part) and triphenylsulphonium hexafluorophosphate (0.3 part) is coated onto a copper clad laminate to a thickness of 6–8 μm. The coating is solidified by heating at 120° C. for 5 minutes. Irradiation of the solidified coating through a negative for 2½ minutes using a 5000 w metal halide lamp at a distance of 75 cm produces an image on development in toluene.

EXAMPLE 22

A mixture of Resin 1 (100 parts), azobis(isobutyronitrile) (3 parts), and diphenyliodosyl hexafluorophosphate (3 parts) is applied to a copper covered laminate as a coating 6–8 μm thick. The coating is solidified by heating in an oven at 120° C. for 30 minutes. The solidified coating is then irradiated through a negative for 1 minute using a 5000 w metal halide lamp at a distance of 75 cm. A good, hard, sharp image is obtained on development in toluene containing 15% acetone. The uncoated layers can be etched using an aqueous solution of ferric chloride (40% $FeCl_3$) at 30° C. for 200 seconds, leaving the coated areas unaffected.

EXAMPLE 23

A mixture of Resin 2 (70 parts), 1,4-butanedioldimethacrylate (30 parts) and diphenyliodosyl hexafluorophosphate (3 parts) is coated onto a copper clad laminate leaving a layer 6–8 μm thick. The layer is heated at 120° C. for 5 minutes, during which time it solidifies. The solidified layer is exposed through a negative to light from a 5000 w metal halide lamp at a distance of 75 cm for 2 minutes. Development in 1,1,1-trichloroethane gives a good sharp image.

What is claimed is:
1. A process for the production of an image comprising
    (i) heating a layer, supported on a carrier, of a liquid composition consisting essentially of effective amounts of
    (A) a compound containing at least one heat-polymerizable, ethylenically unsaturated group,
    (B) a photopolymerizable material, and
    (C) a thermally activated free radical initiator for polymerization of (A)
    at a temperature at which the initiator (C) is activated,
    thereby polymerizing the compound (A) through the heat-polymerizable ethylenically unsaturated group or groups thereof such that the layer solidifies but remains photopolymerizable, and subsequently
    (ii) exposing the solidified layer to actinic radiation in a predetermined pattern such that exposed parts of the layer are photopolymerized and
    (iii) removing those parts of the layer which have not become substantially photopolymerized by treatment with a solvent therefor.
2. A process according to claim 1, in which the liquid composition comprises a mixture of one or more heat-polymerizable substances (A) with one or more substances (B) which are exclusively photopolymerizable.
3. A process according to claim 1, in which the liquid composition comprises one or more dual-functional substances having one or more heat-polymerizable ethylenically unsaturated groups and one or more photopolymerizable groups which is present at both (A) and (B).
4. A process according to claim 1, in which (A) and (B) each have a boiling point above 100° C.
5. A process according to claim 1, in which the heat-polymerizable compound (A) is a styrene, an allylic compound, a cyclohexene or an acrylic ester.
6. A process according to claim 5, in which the heat-polymerizable compound (A) is a styrene of formula

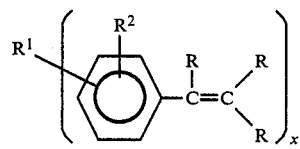

I where
each group R is independently a hydrogen atom or an alkyl group having from 1 to 4 carbon atoms,
x represents 1 or 2, and when x represents 1, R¹ represents a hydrogen atom or an alkyl group having from 1 to 4 carbon atoms, when x represents 2, R¹ represents an alkylene group having from 1 to 4 carbon atoms, an oxygen or sulfur atom, or a carbonyl or sulfonyl group, and R² represents a hydrogen or halogen atom, an alkyl group having from 1 to 6 carbon atoms, a hydroxy group or a glycidyloxy group or the residue of a glycidyloxy group that has been reacted with a phenol or a carboxylic acid.

7. A process according to claim 5, in which the heat-polymerizable compound (A) is an allylic compound of formula

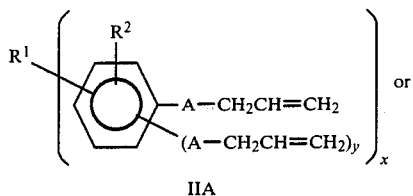

IIA

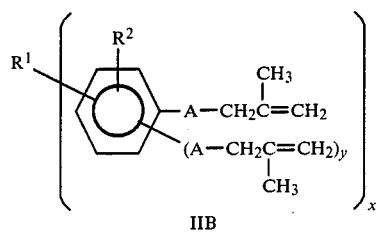

IIB where x represents 1 or 2, and when x represents 1, R¹ represents a hydrogen atom or an alkyl group having from 1 to 4 carbon atoms, when x represents 2, R¹ represents an alkylene group having from 1 to 4 carbon atoms, an oxygen or sulfur atom, or a carbonyl or sulfonyl group, R² represents a hydrogen or halogen atom, an alkyl group having from 1 to 6 carbon atoms, a hydroxy group or a glycidyloxy group or the residue of a glycidyloxy group that has been reacted with a phenol or a carboxlyic acid, y denotes 0 or 1, and A represents a covalent bond, an oxygen atom, or a carbonyloxy group.

8. A process according to claim 5, in which the heat-polymerizable compound (A) is a cyclohexene of formula

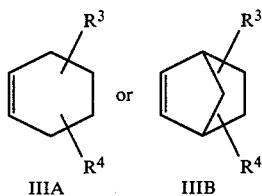

where R³ and R⁴ are each independently a hydrogen atom, a halogen atom, an alkyl group of from 1 to 6 carbon atoms, a carboxyl group or an ester group of from 3 to 10 carbon atoms, or an ester group of from 3 to 10 carbon atoms containing an epoxide group.

9. A process according to claim 5, in which the heat-polymerizable compound (A) is an acrylic ester containing at least one group of formula

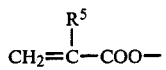

IV where R⁵ represents a hydrogen, chlorine, or bromine atom or an alkyl group of from 1 to 4 carbon atoms.

10. A process according to claim 1, in which the photopolymerizable material (B) is one in which polymerization is effected by direct activation of photosensitive groups through irradiation.

11. A process according to claim 10, in which the photopolymerizable material (B) has at least two groups which are azido, coumarin, stilbene, maleimido, pyridionone, chalcone, propenone, pentadienone, or anthracene groups, or acrylic ester groups which are substituted in their 3-position by a group having ethylenic unsaturation or aromaticity in conjugation with an ethylenic double bond of the acrylic group.

12. A process according to claim 1, in which the photopolymerizable material (B) is one in which irradiation activates a suitable initiator molecule which then activates polymerizable groups.

13. A process according to claim 12, in which the photopolymerizable material (B) is an epoxide resin, phenolic resin, urea-formaldehyde resin, cyclic ether, cyclic ester, cyclic sulfide, cyclic amine or organosilicon cyclic in combination with a radiation-sensitive aromatic onium or iodosyl salt.

14. A process according to claim 3, in which the liquid composition contains a dual-functional material having one or more acrylic ester groups and one or more photosensitive groups which are azido, coumarin, maleimido, chalcone, propenone, pentadienone or anthracene groups, or acrylic ester groups substituted in their 3-position by a group having ethylenic unsaturation or aromaticity in conjugation with an ethylenic double bond of the acrylic ester group.

15. A process according to claim 3, in which the liquid composition contains a dual-functional material having both an epoxide group and an acrylic ester group, together with a radiation-sensitive aromatic onium or iodosyl salt.

16. A process according to claim 1, in which the thermally-activated, free radical initiator (C) is an organic peroxide or hydroperoxide, an azo compound, a sterically crowded phenyl substituted alkane, or an aromatic iodosyl salt.

17. A process according to claim 1, in which stage (i) is carried out by heating the composition at a temperature of from 80° to 150° C.

18. A process according to claim 17, in which the heating is effected for a period of from 2 to 30 minutes.

19. A process according to claim 1, in which the solidified layer is exposed to actinic radiation of wavelength 200–600 nm.

* * * * *